(12) United States Patent
Kim

(10) Patent No.: US 8,102,448 B2
(45) Date of Patent: Jan. 24, 2012

(54) IMAGE SENSOR WITH ENLARGED OUTWARD APPEARANCE OF MICROLENS AND METHOD FOR FABRICATING THE SAME

(75) Inventor: Si-Bum Kim, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 1146 days.

(21) Appl. No.: 11/192,850

(22) Filed: Jul. 28, 2005

(65) Prior Publication Data

US 2006/0023313 A1 Feb. 2, 2006

(30) Foreign Application Priority Data

Jul. 29, 2004 (KR) ........................ 10-2004-0059459

(51) Int. Cl.
*H04N 3/14* (2006.01)
*H04N 5/335* (2011.01)
*H04N 5/225* (2006.01)

(52) U.S. Cl. ..... 348/294; 348/340; 257/233; 250/208.1; 438/65

(58) Field of Classification Search ................ 348/294, 348/302, 305, 311, 315, 335, 340, 360, 304; 359/619, 620; 257/233; 250/208.1; 438/65

See application file for complete search history.

(56) References Cited

U.S. PATENT DOCUMENTS

| 5,453,406 | A  | * | 9/1995  | Chen ............................. 438/763 |
| 5,760,834 | A  | * | 6/1998  | Rostoker ....................... 348/340 |
| 6,157,017 | A  | * | 12/2000 | Kim ............................ 250/208.1 |
| 6,171,883 | B1 | * | 1/2001  | Fan et al. ........................ 438/65 |
| 6,239,034 | B1 | * | 5/2001  | Yang et al. ..................... 438/697 |
| 6,271,103 | B1 | * | 8/2001  | Lee ................................ 438/464 |
| 6,414,343 | B1 | * | 7/2002  | Kondo et al. ................. 257/294 |
| 6,586,811 | B2 | * | 7/2003  | Sekine .......................... 257/432 |
| 7,642,119 | B2 | * | 1/2010  | Jung ............................... 438/69 |
| 7,713,777 | B2 | * | 5/2010  | Ryu ................................ 438/70 |
| 2005/0003659 | A1 | * | 1/2005 | Markowitz et al. ........... 438/641 |
| 2005/0024520 | A1 | * | 2/2005 | Yamamoto .................... 348/340 |

FOREIGN PATENT DOCUMENTS

| KR | 1999-0073943   |   | 10/1999 |
| KR | 2000-0075371   |   | 12/2000 |
| KR | 1020010061335 A | * | 7/2001 |

* cited by examiner

*Primary Examiner* — David Ometz
*Assistant Examiner* — Carramah J Quiett
(74) *Attorney, Agent, or Firm* — McAndrews, Held & Malloy Ltd.

(57) ABSTRACT

An image sensor with an enlarged outward appearance of a microlens and a method for fabricating the same are provided. The image sensor includes: a plurality of microlenses formed on a semiconductor substrate with a certain spacing distance; and a protection layer formed over the microlenses, wherein the protection layer includes a first oxide layer which is formed by a plasma enhanced chemical vapor deposition (PECVD) method and a second oxide layer which is formed by a spin on glass (SOG) method over the first oxide layer to maintain sufficient step coverage over chasms between the microlenses.

38 Claims, 4 Drawing Sheets

IMAGE SENSOR WITH ENLARGED OUTWARD APPEARANCE OF MICROLENS AND METHOD FOR FABRICATING THE SAME

FIELD OF THE INVENTION

The present invention relates to an image sensor and a method for fabricating the same; and, more particularly, to an image sensor including a protection layer for a microlens and a method for fabricating the same.

DESCRIPTION OF RELATED ARTS

An image sensor is a semiconductor device which converts an optical image to an electric-signal, and a charge coupled device (CCD) and a complementary metal-oxide-silicon (CMOS) are examples of the image sensor.

The CCD is a semiconductor device, which transfers and stores charge carriers into metal-oxide-silicon (MOS) capacitors located very closely to each other.

On the other side, the CMOS image sensor is a semiconductor device which employs a switching method. The switching method forms MOS transistors in the same number as pixels by utilizing CMOS technology which uses a control circuit and a signal processing circuit as a peripheral circuit, and employs the MOS transistors to detect outputs one by one.

Currently, the CMOS image sensor is widely used in portable image sensing devices due to its advantages such as high degree of integration and low operation voltage.

FIG. 1 is a simplified layout of a conventional image sensor pixel that has a common active region with a pinned photodiode and four transistors.

In FIG. 1, a reference numeral 100 represents the simplified layout diagram of the conventional 4T pixel used in typical CMOS image sensors. Many such pixels are arranged in an array forming rows and columns in the actual image sensor, but for the simplicity of the drawing only one is shown in a greater detail. An active region 101 contains active elements of the pixel; those are, a pinned photodiode 102, a transfer gate 103, a floating diffusion (FD) node 104, a reset gate 106, a drain bias node 118, a drive transistor gate 113 serving as a source follower (SF), a source-drain region 119, an address select transistor gate 114, and an address select transistor 120.

The area outside of the enclosed active region 101 is a shallow trench isolation (STI) region that is filled with thick isolation silicon dioxide. Also, in FIG. 1, the multilevel metal interconnects present in the pixel have been for clarity of the drawing omitted and replaced schematically by lines. A first horizontal line 117 is a row address line connected to a first contact 116 of the address select transistor gate 114, a second horizontal line 111 is a row transfer line connected to a second contact 112 of the transfer gate 103, and a poly-silicon bus 105 supplies a row reset signal to the reset gate 106 of the pixel. A first column line 108 provides the Vdd bias via third contact 109 to the drain bias node 118, while a second column line 107 carries the output signal from a source of the address select transistor 120 via fourth contact 115 to the column signal processing circuits located at the periphery of the array. The FD node 104 is connected to the drive transistor gate 113 via interconnect 110. The addressing signals are supplied to the pixels also from the periphery of the array through the first horizontal line 117, the fourth contact 115 and the poly-silicon bus 105.

On the other hand, a color filter and a microlens are sequentially formed in layers over the top surface of the pixel with the above layout.

Due to the decreasing design rule, areas of this type of unit pixels are being scaled down, causing the unit elements to be disposed in a layered structure.

To prevent a decrease of light sensitivity caused by a reduced photodiode region which is a light receiving region, the microlens is formed in a convex or a concave form to maximally focus the light upon the photodiode layer.

FIG. 2 is a top view showing a conventional layout of unit pixels for three colors.

Referring to FIG. 2, two green color unit pixels 'G's, a red color unit pixel 'R' and a blue color unit pixel 'B' are laid out.

Typically, a CMOS image sensor embodies only one color per one pixel, and expresses each of the R, G and B colors assigned to each pixel through an interpolation method.

As mentioned above, the CMOS image sensor contains one microlens on each of the unit pixels to focus the incident light upon the photodiode formed inside a silicon substrate.

FIG. 3 is a simplified view illustrating a formation process of a conventional microlens.

As shown, a microlens ML is made of a polymer such as photoresist PR. The microlens ML is formed through patterning by a photo lithography process and flowing by a baking process at a high temperature.

There should be a certain spacing distance between a microlens and an adjacent microlens because of the above mentioned flow process characteristic. If a spacing distance is less than the certain spacing distance, the adjacent microlenses stick together during the flow process, resulting in deformed microlenses.

The spacing distance between the microlenses implies that the incident light is not utilized 100%. For example, if the size of a unit pixel is 3 µm×3 µm and a microlens is formed 0.2 µm smaller than the unit pixel, an area coverage percentage becomes approximately 87% (i.e., 2.8×2.8/3.0×3.0). That is, 13% of the incident light is wasted in this case.

The above kind of limitations induce even more serious limitations as the sizes of unit pixels are being scaled down due to the large integration scale of CMOS image sensors.

Meantime, a protection layer is used to resolve disadvantages such as scratches caused by external impacts. The protection layer is formed by employing low temperature oxide (LTO) to prevent deformation of the microlens.

FIG. 4 is a cross-sectional view illustrating a conventional microlens with a protection layer.

As shown, a layer of LTO is formed on top of a microlens ML as a protection layer. The LTO layer is formed by a plasma enhanced chemical vapor deposition (PECVD) method at a temperature of 150° C. Herein, a reference denotation 'W' expresses the size of the outward appearance of the microlens ML.

Typically, an LTO layer not only functions as a protection layer, but the LTO layer functions to enlarge an outward appearance of a microlens.

On the other hand, although the LTO layer formed at a low temperature of 150° C. by the PECVD method prevents deformation of the microlens ML, the LTO layer is not so superior in step coverage.

Due to the above characteristic, the LTO layer is formed in a uniform thickness on top of the microlens ML, but a desired thickness of the LTO layer cannot be maintained on the lateral sides of the microlens ML.

Because of the unsatisfactory step coverage, the original size of the microlens ML and the size of the outward appearance of the microlens ML with the LTO layer are practically identical.

Therefore, a process technology development is needed to prevent microlens deformation with a low temperature formation process and maintain a superior step coverage characteristic.

SUMMARY OF THE INVENTION

It is, therefore, an object of the present invention to provide an image sensor capable of preventing microlens deformation during a low temperature process and maintaining a superior step coverage characteristic and a method for fabricating the same.

In accordance with an aspect of the present invention, there is provided an image sensor, including: a plurality of microlenses formed on a semiconductor substrate with a certain spacing distance; and a protection layer formed over the microlenses, wherein the protection layer includes a first oxide layer which is formed by a plasma enhanced chemical vapor deposition (PECVD) method and a second oxide layer which is formed by a spin on glass (SOG) method over the first oxide layer to maintain sufficient step coverage over chasms between the microlenses.

In accordance with another aspect of the present invention, there is provided an image sensor, including: a plurality of microlenses formed on a semiconductor substrate with a certain spacing distance; and a protection layer formed over the microlenses, wherein the protection layer includes a first oxide layer which is formed by a plasma enhanced chemical vapor deposition (PECVD) method and a second oxide layer which is formed by a chemical vapor deposition (CVD) method over the first oxide layer to maintain sufficient step coverage over chasms between the microlenses.

In accordance with still another aspect of the present invention, there is provided a method for forming an image sensor, including: forming a plurality of microlenses on a substrate; forming a first oxide layer on the microlenses by employing a plasma enhanced chemical vapor deposition (PECVD) method; and forming a second oxide layer over the first oxide layer by employing a spin on glass (SOG) method to maintain sufficient step coverage over chasms between the microlenses.

In accordance with further aspect of the present invention, there is provided a method for forming an image sensor, including: forming a plurality of microlenses on a substrate; forming a first oxide layer on the microlenses by employing a plasma enhanced chemical vapor deposition (PECVD) method; and forming a second oxide layer over the first oxide layer by employing a chemical vapor deposition (CVD) method to maintain sufficient step coverage over chasms between the microlenses.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

An image sensor with an enlarged outward appearance of a microlens and a method for fabricating the same in accordance with certain embodiments of the present invention will be described in detail with reference to the accompanying drawings.

Figure 1:
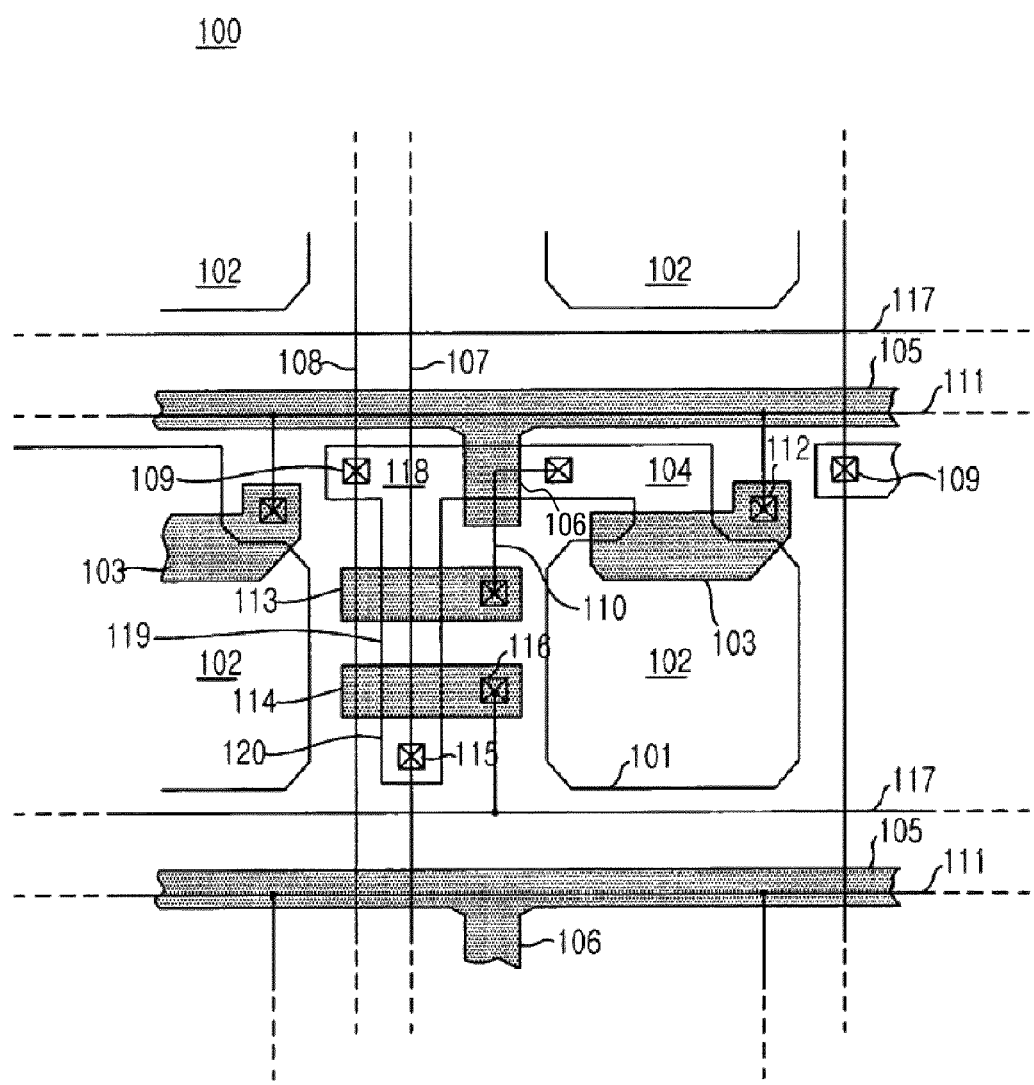
FIG. 1 is a simplified layout of a conventional image sensor pixel that has a common active region with a pinned photodiode and transistors.
Figure 2:
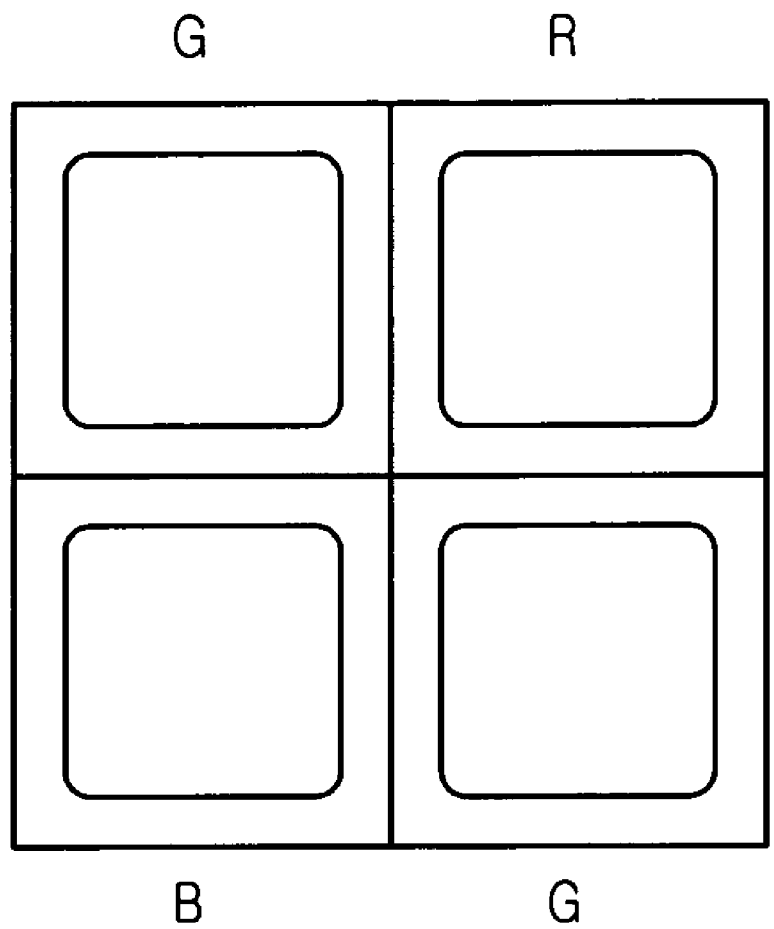
FIG. 2 is a top view showing a conventional layout of unit pixels for three colors.
Figure 3:
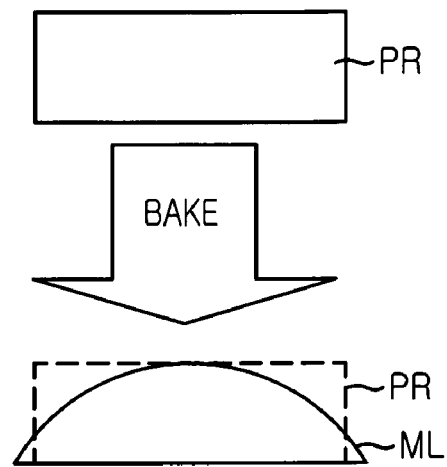
FIG. 3 is a simplified view illustrating a formation process of a conventional microlens.
Figure 4:
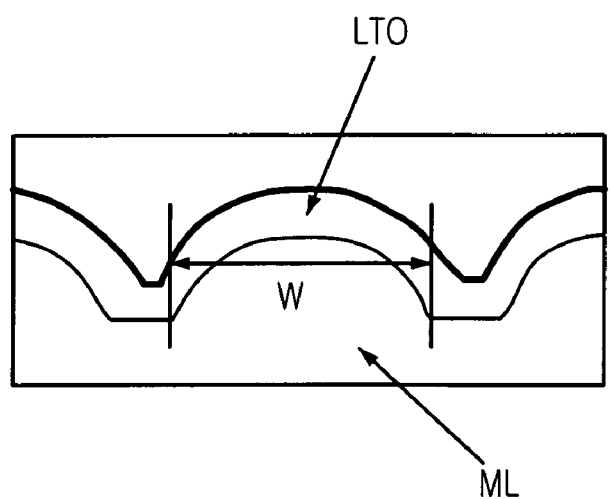
FIG. 4 is a cross-sectional view illustrating a conventional microlens with a protection layer.
Figure 5:
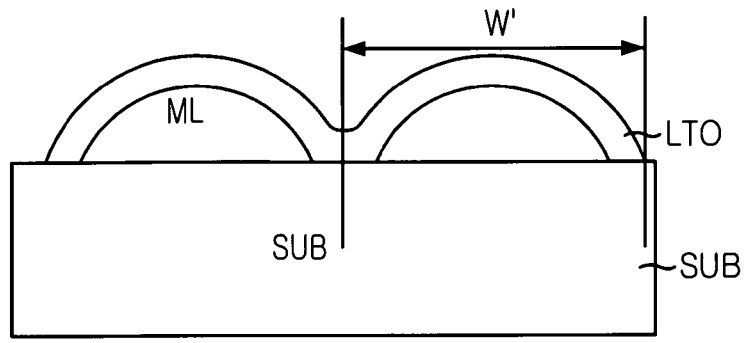
FIG. 5 is a cross-sectional view illustrating enlarged outward appearances of microlenses caused by a flowable protection layer in accordance with a specific embodiment of the present invention.

FIG. 5 is a cross-sectional view illustrating enlarged outward appearances of microlenses caused by a flowable protection layer in accordance with a specific embodiment of the present invention.

Referring to FIG. 5, although not illustrated, light receiving elements such as photodiodes, various transistors, metal wirings and color filters are formed on a substrate SUB. Also, microlenses ML are formed on the above resulting substrate structure, and a protecton layer of low temperature oxide (LTO) is formed over the microlenses ML.

According to the specific embodiment of the present invention, it is targeted to provide the LTO layer that can be formed by a low temperature process with superior step coverage. Thus, superior step coverage over a chasm between the microlenses ML is maintained and an outward appearance can be enlarged up to a length of 'W''.

Therefore, the protection layer in this specific embodiment of the present invention is structured in layers of either: an LTO layer by a plasma enhanced chemical vapor deposition (PECVD) method and an LTO layer by a spin on glass (SOG) method with a superior step coverage characteristic; or an LTO layer by a PECVD method and an LTO layer by a chemical vapor deposition (CVD) method which utilizes silicon hydride ($SiH_4$) and hydrogen peroxide ($H_2O_2$) as sources with a superior step coverage characteristic.

The protection layer formation process mentioned above is described in detail through an embodiment below.

Figure 6:
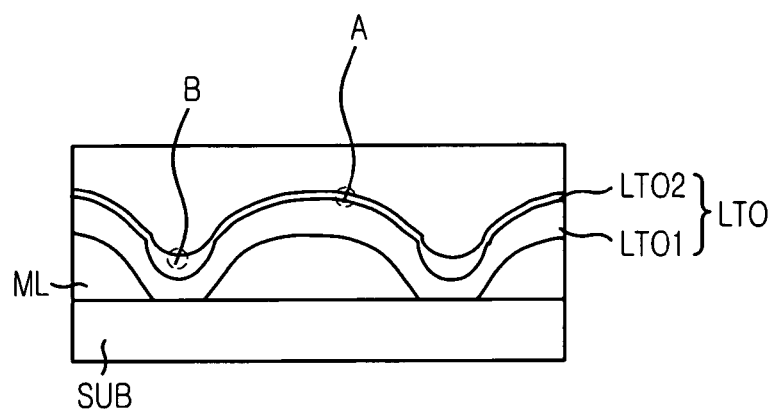
FIG. 6 is a cross-sectional view illustrating microlenses with a protection layer formed by an SOG method in accordance with a specific embodiment of the present invention.

FIG. 6 is a cross-sectional view illustrating microlenses on which a protection layer is formed by an SOG method in accordance with a specific embodiment of the present invention.

Referring to FIG. 6, microlenses ML are formed on a substrate SUB, and then a protection layer LTO is formed by an SOG method over the microlenses ML to maintain sufficient step coverage over chasms among the microlenses ML. The protection layer LTO includes a material such as LTO.

When forming the protection layer LTO, a first protection layer LTO1 is first formed by a PECVD method on the upper portion of the individual microlens ML, and then a second protection layer LTO2 is formed by the SOG method to sufficiently cover the chasms. Due to an application characteristic of fluidity of the SOG method, the second protection layer LTO2 is concentrated at the topologically lower regions (i.e., chasms) as indicated by a reference denotation 'B', and thinly formed on the upper portion of the individual microlens ML as indicated by a reference denotation 'A'.

The protection layer formation process in FIG. 6 is described in further detail as follows. Herein, only one microlens ML is described below for the convenience of description.

First, the first protection layer LTO1 is formed by the PECVD method and then the second protection layer LTO2 is formed by the SOG method on the microlens ML. Herein, a chemical used in the SOG method should have extremely low viscosity. That is, the second protection layer LTO2 with a viscosity value ranging from approximately 1.0 to approximately 2.5 is used. The second protection layer LTO2 includes a silicate SOG layer that is formed by employing pure silicon dioxide ($SiO_2$). A typical SOG layer is formed by employing a material including carbon or hydrogen to maintain stability and inner uniformity. In this embodiment, it is preferable to use the silicate SOG layer formed by employing pure $SiO_2$ in consideration of a light characteristic of the SOG layer. However, considering light transmittance, an SOG layer formed by employing siloxane or hydrogen silsesquioxane can be used as well.

Preferably, an SOG layer thickness on a flat wafer is set in a range of approximately 100 Å to approximately 2000 Å in accordance with a typical microlens form standard. After the formation of the SOG layer (i.e., the second protection layer LTO2), a baking process is performed at a temperature in a range of approximately 100° C. to approximately 250° C. to remove moisture within the SOG layer.

Figure 7:
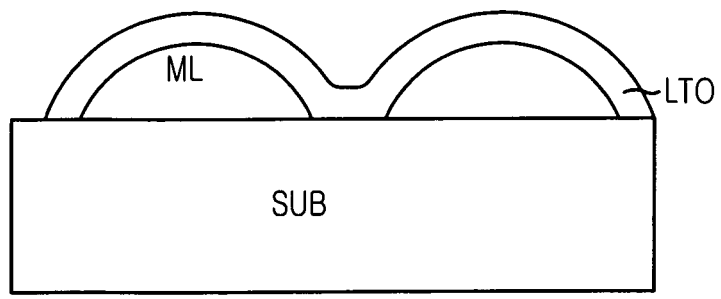
FIG. 7 is a cross-sectional view illustrating microlenses with a protection layer formed by a chemical vapor deposition (CVD) method in accordance with another specific embodiment of the present invention.

FIG. 7 is a cross-sectional view illustrating microlenses with a protection layer formed by a CVD method which utilizes $SiH_4$ and $H_2O_2$ as sources.

Referring to FIG. 7, microlenses ML are formed on a substrate SUB, and then a protection layer LTO is formed over the microlenses ML by a CVD method which utilizes $SiH_4$ and $H_2O_2$ as sources to maintain sufficient step coverage over a chasm between the microlenses ML. The protection layer LTO includes a material such as LTO.

Although not illustrated, when forming the protection layer LTO, a first protection layer is thinly formed by a PECVD method on the upper portion of the individual microlens ML, and then a second protection layer is formed by the CVD method which utilizes $SiH_4$ and $H_2O_2$ as sources to sufficiently cover the chasm. Due to an application characteristic of fluidity of the CVD method which utilizes $SiH_4$ and $H_2O_2$ as sources, the second protection layer is concentrated at the topologically lower regions (i.e., chasms).

In more detail of the protection layer formation process in FIG. 7, the first protection layer which includes LTO is formed on the microlenses ML by the PECVD method and then the second protection layer which also includes LTO is formed by the CVD method which utilizes $SiH_4$ and $H_2O_2$ as sources. Herein, during performing the CVD method, $SiH_4$ reacts with $H_2O_2$ at a temperature in a range of approximately 0° C. to approximately 100° C. to form a $Si(OH)_4$ layer on the microlenses ML.

However, since the $Si(OH)_4$ layer exhibits a fluidity characteristic in a quasi-liquid state, the $Si(OH)_4$ layer is formed thick over the chasm and formed thin on the upper portion of the individual microlens ML. A baking process is then performed at a temperature in a range of approximately 50° C. to approximately 250° C. to remove a —OH functional group and as a result, a $SiO_2$ layer is formed.

The above specific embodiments of the present invention showed that prevention of microlens deformation with a low temperature process and an enlarged outward appearance of a microlens can be achieved through: forming a first protection layer by a typical method, e.g., a PECVD method; and then forming a second protection layer by an SOG method or a CVD method which utilizes $SiH_4$ and $H_2O_2$ as sources, maintaining sufficient step coverage over chasms among a plurality of microlenses. The first protection layer can include a material such as LTO, and the second protection layer can include a material such as silicate SOG layer or LTO.

The present application contains subject matter related to the Korean patent application No. KR 2004-59459, filed in the Korean Patent Office on Jul. 29, 2004, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. An image sensor, comprising:
   a plurality of microlenses formed on a semiconductor substrate; and
   a protection layer formed over the microlenses;
   wherein the protection layer includes a first oxide layer which is formed by a plasma enhanced chemical vapor deposition (PECVD) method, and a second oxide layer which is formed by a spin on glass (SOG) method over the first oxide layer;
   wherein the SOG method uses a chemical with viscosity in a range of approximately 1.0 to approximately 2.5; and
   wherein the second oxide layer is thicker over chasms between the microlenses than over upper portions of the microlenses.

2. The image sensor of claim 1, wherein the second oxide layer is formed in a thickness ranging from approximately 100 Å to approximately 2000 Å.

3. The image sensor of claim 1, wherein the second oxide layer comprises a material selected from a group consisting of silicate, siloxane, and silsesquioxane.

4. An image sensor, comprising:
   a plurality of microlenses formed on a semiconductor substrate; and
   a protection layer formed over the microlenses;
   wherein the protection layer includes a first oxide layer which is formed by a plasma enhanced chemical vapor deposition (PECVD) method, and a second oxide layer which is formed by a chemical vapor deposition (CVD) method over the first oxide layer,
   wherein the plasma enhanced chemical vapor deposition (PECVD) method is performed at a temperature of approximately 150° C.; and
   wherein the second oxide layer is thicker over chasms between the microlenses than over upper portions of the microlenses.

5. The image sensor of claim 4, wherein the CVD method uses silicon hydride ($SiH_4$) and hydrogen peroxide ($H_2O_2$) as sources to form the second oxide layer.

6. A method of forming an image sensor, the method comprising:
   forming a plurality of microlenses on a substrate; forming a first oxide layer on the microlenses by using a plasma enhanced chemical vapor deposition (PECVD) method; and
   forming a second oxide layer over the first oxide layer by using a spin on glass (SOG) method, wherein the SOG method uses a chemical with a viscosity in a range of approximately 1.0 to approximately 2.5, wherein said forming a second oxide layer comprises forming the second oxide layer such that the second oxide layer is thicker over chasms between the microlenses than over upper portions of the microlenses.

7. The method of claim 6, wherein said forming a second oxide layer comprises:
forming the second oxide layer by using the SOG method; and
baking the second oxide layer to remove moisture within the second oxide layer.

8. The method of claim 7, wherein the second oxide layer is formed in a thickness ranging from approximately 100 Å to approximately 2000 Å.

9. The method of claim 7, wherein the second oxide layer comprises a material selected from a group consisting of silicate, siloxane, and silsesquioxane.

10. The method of claim 7, wherein said baking is performed at a temperature ranging from approximately 100° C. to approximately 250° C.

11. A method of forming an image sensor, the method comprising:
forming a plurality of microlenses on a substrate;
forming a first oxide layer on the microlenses by using a plasma enhanced chemical vapor deposition (PECVD) method; and
forming a second oxide layer over the first oxide layer by using a chemical vapor deposition (CVD) method, wherein the plasma enhanced chemical vapor deposition (PECVD) method is performed at a temperature of approximately 150° C.

12. The method of claim 11, wherein the CVD method uses silicon hydride ($SiH_4$) and hydrogen peroxide ($H_2O_2$) as sources to form the second oxide layer.

13. The method of claim 12, wherein said forming a second oxide layer comprises:
forming a $Si(OH)_4$ layer through a reaction between the provided $SiH_4$ and the provided $H_2O_2$; and
baking the $Si(OH)_4$ layer to remove an —OH functional group, thereby forming a silicon dioxide ($SiO_2$) layer.

14. The method of claim 13, wherein the $Si(OH)_4$ layer is formed at a temperature ranging from approximately 0° C. to approximately 100° C.

15. The method of claim 13, wherein the $Si(OH)_4$ layer is baked at a temperature ranging from approximately 50° C. to approximately 250° C. to remove the —OH functional group.

16. An image sensor, comprising:
a plurality of microlenses formed on a semiconductor substrate; and
a protection layer formed over the microlenses and configured to protect the plurality of microlenses during operation of the image sensor;
wherein the protection layer includes a first oxide layer formed on the plurality of microlenses and a second oxide layer formed on the first oxide layer; and
wherein the second oxide layer has a greater step coverage than the first oxide layer.

17. The image sensor of claim 16, wherein:
a plasma enhanced chemical vapor deposition (PECVD) layer forms the first oxide layer; and
a spin on glass (SOG) layer forms the second oxide layer.

18. The image sensor of claim 16, wherein the second oxide layer is formed using a chemical with viscosity in a range of approximately 1.0 to approximately 2.5.

19. The image sensor of claim 16, wherein:
a plasma enhanced chemical vapor deposition (PECVD) layer forms the first oxide layer; and
a chemical vapor deposition (CVD) layer forms the second oxide layer.

20. The image sensor of claim 19, wherein the CVD layer is formed at a temperature of approximately 150° C.

21. The image sensor of claim 19, wherein the CVD layer is formed using silicon hydride ($SiH_4$) and hydrogen peroxide ($H_2O_2$) sources.

22. The image sensor of claim 16, wherein the second oxide layer is thicker between microlenses of the plurality of microlenses than over upper portions of the microlenses of the plurality of microlenses.

23. The image sensor of claim 16, wherein the second oxide layer has a thickness ranging from approximately 100 Å to approximately 2000 Å.

24. The image sensor of claim 16, wherein the second oxide layer comprises a material selected from a group consisting of silicate, siloxane, and silsesquioxane.

25. A method of forming an image sensor, the method comprising:
forming a plurality of microlenses on a substrate; and
forming a protection layer over the plurality of microlenses that protects the plurality of microlenses during use of the image sensor;
wherein said forming a protection layer includes:
forming a first oxide layer on the plurality of microlenses; and
forming a second oxide layer on the first oxide layer, wherein the second oxide layer has greater step coverage than the first oxide layer.

26. The method of claim 25, further comprising:
using a plasma enhanced chemical vapor deposition (PECVD) method to form the first oxide layer; and
using a spin on glass (SOG) method to form the second oxide layer.

27. The method of claim 25, further comprising:
using a plasma enhanced chemical vapor deposition (PECVD) method to form the first oxide layer; and
using a chemical with a viscosity in a range of approximately 1.0 to approximately 2.5 in a spin on glass (SOG) method to form the second oxide layer.

28. The method of claim 25, wherein said forming a second oxide layer comprises:
using a spin on glass (SOG) method to form the second oxide layer; and
baking the second oxide layer to remove moisture within the second oxide layer.

29. The method of claim 25, wherein said forming a second oxide layer comprises:
using a spin on glass (SOG) method to form the second oxide layer; and
baking the second oxide layer at a temperature ranging from approximately 100° C. to approximately 250° C. to remove moisture within the second oxide layer.

30. The method of claim 25, wherein said forming a second oxide layer comprises forming the second oxide layer such that the second oxide layer is thicker between microlenses of the plurality of microlenses than over upper portions of the microlenses of the plurality of microlenses.

31. The method of claim 25, wherein said forming a second oxide layer comprises forming the second oxide layer with a thickness ranging from approximately 100 Å to approximately 2000 Å.

32. The method of claim 25, wherein said forming a second oxide layer comprises forming the second oxide layer with a material selected from a group consisting of silicate, siloxane, and silsesquioxane.

33. The method of claim 25, further comprising:
using a plasma enhanced chemical vapor deposition (PECVD) method to form the first oxide layer; and
using a chemical vapor deposition (CVD) method to form the second oxide layer.

34. The method of claim 25, further comprising:
using a plasma enhanced chemical vapor deposition (PECVD) method to form the first oxide layer; and
using a chemical vapor deposition (CVD) method at a temperature of approximately 150° C. to form the second oxide layer.

35. The method of claim 34, further comprising using silicon hydride ($SiH_4$) and hydrogen peroxide ($H_2O_2$) as sources to form the second oxide layer during the CVD method.

36. The method of claim 35, wherein said forming a second oxide layer comprises:
forming a $Si(OH)_4$ layer through a reaction between the provided $SiH_4$ and the provided $H_2O_2$; and
baking the $Si(OH)_4$ layer to remove an —OH functional group to obtain a silicon dioxide ($SiO_2$) layer.

37. The method of claim 35, wherein said forming a second oxide layer comprises:
forming a $Si(OH)_4$ layer through a reaction between the provided $SiH_4$ and the provided $H_2O_2$ at a temperature ranging from approximately 0° C. to approximately 100° C.; and
baking the $Si(OH)_4$ layer to remove an —OH functional group and obtain a silicon dioxide ($SiO_2$) layer.

38. The method of claim 35, wherein said forming a second oxide layer comprises:
forming a $Si(OH)_4$ layer through a reaction between the provided $SiH_4$ and the provided $H_2O_2$; and
baking the $Si(OH)_4$ layer at a temperature ranging from approximately 50° C. to approximately 250° C. to remove an —OH functional group and obtain a silicon dioxide ($SiO_2$) layer.

* * * * *